United States Patent [19]

Krueger et al.

[11] 4,456,515
[45] Jun. 26, 1984

[54] METHOD FOR MAKING POLARIZERS COMPRISING A MULTIPLICITY OF PARALLEL ELECTRICALLY CONDUCTIVE STRIPS ON A GLASS CARRIER

[75] Inventors: Hans Krueger, Munich; Hans Rehme, Zorneding, both of Fed. Rep. of Germany

[73] Assignee: Siemens Aktiengesellschaft, Berlin & Munich, Fed. Rep. of Germany

[21] Appl. No.: 28,983

[22] Filed: Apr. 11, 1979

[30] Foreign Application Priority Data

Apr. 25, 1978 [DE] Fed. Rep. of Germany ....... 2818103

[51] Int. Cl.³ .................... G02B 5/30; C23C 15/00
[52] U.S. Cl. ............................. 204/192 P; 156/640; 156/643; 204/192 EC; 204/192 E; 350/370; 350/395; 427/163; 427/250; 427/255
[58] Field of Search .............. 427/250, 255, 163, 256, 427/269, 271, 287; 204/192 P, 192 E, 192 EC; 156/640, 643; 350/147, 370, 395

[56] References Cited

U.S. PATENT DOCUMENTS

| | | | |
|---|---|---|---|
| 3,046,839 | 7/1962 | Bird et al. | 350/147 X |
| 3,235,630 | 2/1966 | Doherty et al. | 350/147 X |
| 3,353,895 | 11/1967 | Emerson | 350/397 |
| 3,585,121 | 6/1971 | Franks et al. | 204/192 EC |
| 3,969,545 | 7/1976 | Slocum | 427/163 |

OTHER PUBLICATIONS

Navez et al., Electronic Microscopy . . . , Transactions of the Meetings of Academy of Sciences [France], T. 254, (1/8/1962), No. 2, pp. 240-242.
P. D. Townsend et al., Ion Implantation, Sputtering and their Applications, Academic Press, London, 1976, pp. 128-142.
Hugh Garvin et al., Ion Beam Micromachining of Integrated Optics Components, Applied Optics, vol. 12, No. 3, Mar. 1973, pp. 455-459.
L. Mader and J. Hoepfner, Ion Beam Etching of Silicon Dioxide on Silicon, J. Electrochem. Soc., vol. 123, No. 12, Dec. 1976, pp. 1893-1898.
J. P. Auton and M. C. Hutley, Grid Polarizers for Use in the Near Infrared, Infrared Physics, vol. 12, No. 2, 1972, pp. 95-100.
Ye. N. Orel, The Deposition of a Metallic Coating on a Grating Polarizer, Optical Technology, vol. 39, No. 4, Apr. 1972, pp. 215-216.

Primary Examiner—G. L. Kaplan
Assistant Examiner—W. T. Leader
Attorney, Agent, or Firm—Hill, Van Santen, Steadman & Simpson

[57] ABSTRACT

A method for producing polarizers, comprising a multiplicity of parallel electrically conductive strips on a glass carrier, having a raster measurement of approximately 1/10 of the light wave length, is characterized in that a layer having a wavy surface is provided of conductive material, having a surface waviness with a period of approximately 50 nm perpendicular to the vapor application direction carried on a glass carrier by means of vapor deposition, selective chemical deposition and the like, with a prescribed deposition angle, and a portion of the material is removed by particle bombardment at a prescribed bombardment angle, with either electrically neutral particles or ions, so that an arrangement of a multiplicity of microstrips is provided in which the microstrips are parallel to one another and separated from and thus electrically insulated from one another on a glass carrier plate.

27 Claims, 10 Drawing Figures

METHOD FOR MAKING POLARIZERS COMPRISING A MULTIPLICITY OF PARALLEL ELECTRICALLY CONDUCTIVE STRIPS ON A GLASS CARRIER

BACKGROUND OF THE INVENTION

Field of the Invention

The present invention relates to a method for producing polarizers comprising a multiplicity of electrically conductive parallel strips carried on a glass carrier, which polarizers have a raster measurement of approximately 1/10 of the light wave length.

SUMMARY OF THE INVENTION

The present invention has the underlying object of providing an inexpensive and readily reproducible method with the aid of which polarizing filters of the type initially mentioned above may be produced. In accordance with the underlying knowledge that the spacing and widths of electrically conductive metal layers, arranged parallel to one another, and necessary for the purpose of light polarization, can be produced on a glass carrier by means of oblique vapor deposition and/or oblique bombardment.

The foregoing object is achieved in that a first method step is provided, in which a wavy, dune-shaped layer of conductive material having an even surface waviness with a period of approximately 50 nm perpendicular to the vapor deposition direction is applied to a glass carrier plate, and that a second method step is provided, in which a prescribed amount of the dune-shaped layer is removed by particle bombardment at a prescribed bombardment angle so that an arrangement of a multiplicity of micro-strips, parallel to one another and separated from one another and thus electrically insulated from one another, is formed on the glass carrier plate.

The present invention offers the advantage that a relatively inexpensive and readily reproducible production method is provided for polarizers and that the durability of the polarizers produced in accordance with the method is increased vis-a-vis conventional polarizers.

A further development of the invention is characterized in that a first method step is provided, in which, for the formation of a uniform periodic surface structure on the glass carrier plate, such an angle of incidence of particles is prescribed that a period >50 nm <5000 nm results and that a second method step is provided, in which, with the aid of a vapor deposition source oriented perpendicularly to the longitudinal extension of the micro-grooves produced in the first method step, a vapor deposition of electrically conductive material is carried out at a prescribed vapor deposition angle or incidence, so that respectively only on the interior surfaces of the respective micro-grooves facing the vapor deposition source, material is deposited, whereby a prescribed arrangement of micro-strips is formed on the glass carrier plate exhibiting a surface structure in toto which orients liquid crystal molecules with a definite set angle (angle of attack).

In a further development of the invention, an advantage is offered that polarizers can be produced with a small number of method steps, the polarizers having a base which is the surface structure of the glass carrier plate which permits the orientation of the liquid crystal molecules necessary for liquid crystal displays, so that altogether liquid crystal displays having optimum properties can be produced.

BRIEF DESCRIPTION OF THE DRAWINGS

Other objects, features and advantages of the invention, its organization, construction and mode of operation will be best understood from the following detailed description, taken in conjunction with the accompanying drawings, on which.

DESCRIPTION OF THE PREFERRED EMBODIMENTS

Figure 1:
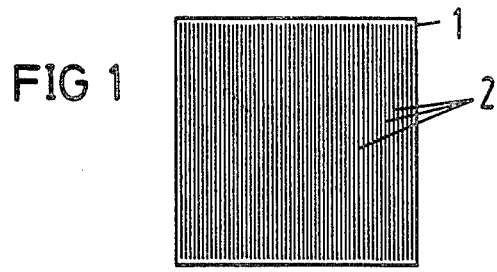
FIG. 1 is a schematic representation of a top view of a polarizer which consists of a glass carrier plate and micro-strips arranged on the glass plate parallel to one another.

As already briefly explained above, FIG. 1 schematically illustrates a polarizer 1, in a top view, consisting of a glass carrier plate and a plurality of micro-strips 2 which are arranged thereupon parallel and spaced from one another. The effect of such a polarizer, as is known in the art, is based on the adjustment of the resulting distance/width raster of the arrangement of micro-strips to the median wave length of visible light.

Figure 2:
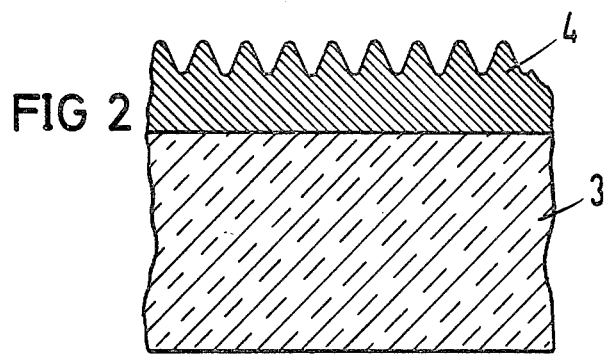
FIG. 2 illustrates a segment of a glass carrier plate, in cross section, having a wavy, dune-shaped layer 4 applied to the plate by means of oblique vapor deposition.
Figure 4:
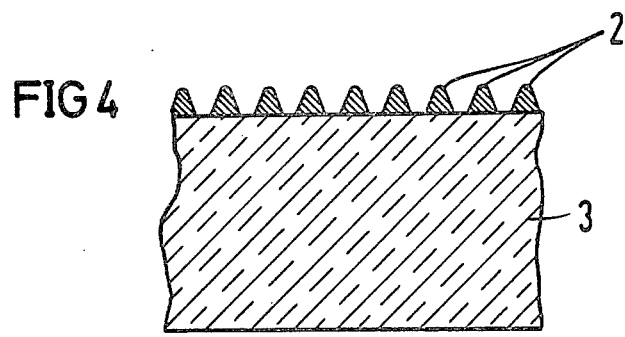
FIG. 4 illustrates a segment of a glass carrier plate, also in cross section, on which micro-strips are provided parallel and separated from one another, and thus electrically insulated from one another, the micro-strips being obtained by the method of the present invention.

FIG. 2 illustrates, as also already mentioned above, a segment of a glass carrier plate in cross section and a wavy, dune-shaped layer 4 applied thereupon by means of oblique vapor deposition. The formation of such a wavy surface can be obtained with vapor deposition techniques at a predetermined vapor deposition angle. It is only a peculiarity of such a vapor deposition method that the waviness of the surface exhibits a period of approximately 500 Å having a suitable deposition angle, which is well adjusted to the function of a polarizer for visible light realized therewith. Now, in accordance with FIG. 4, an arrangement of micro-strips 2, aligned parallel to one another, is to be obtained from the dune-shaped layer 4 in that, in an additional method step, a particle bombardment at a prescribed bombardment angle is undertaken with the aid of which a removal of material results. The removal of material with the aid of particle bombardment is known per se.

Figure 3:
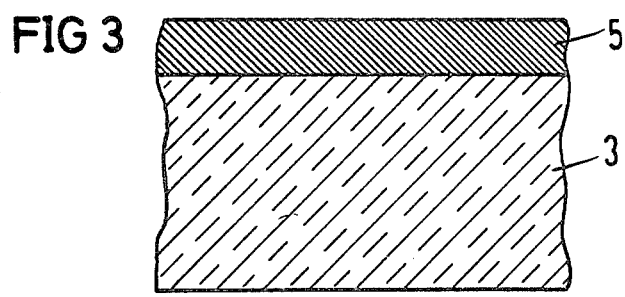
FIG. 3 also illustrates a segment of a glass carrier plate, also in cross section, having a planar layer 5 applied to the plate.

FIG. 3 illustrates, as also already explained above, a segment of a glass carrier plate 3 in cross section, having a planar layer 5 of conductive material applied thereon. Such a layer 5 is formed, in accordance with a further development of the invention, in that the vapor deposition of the glass carrier plate 3 is undertaken with a vapor deposition angle advantageously being 90°. In this exemplary embodiment, a particle bombardment is provided at a prescribed angle of incidence in order to produce a wavy surface structure, by means of which micro-grooves are impressed into the planar layer 5. The final surface structure in accordance with FIG. 4, and also according to the further development of the invention, is obtained in that a method step is provided in place of the second method step mentioned above, in which a waviness of the originally planar layer 5 is formed with the aid of particle bombardment at an angle aligned with the processing plane so that a prescribed arrangement of micro-strips 2 is formed on the glass carrier plate 3.

Figure 5:
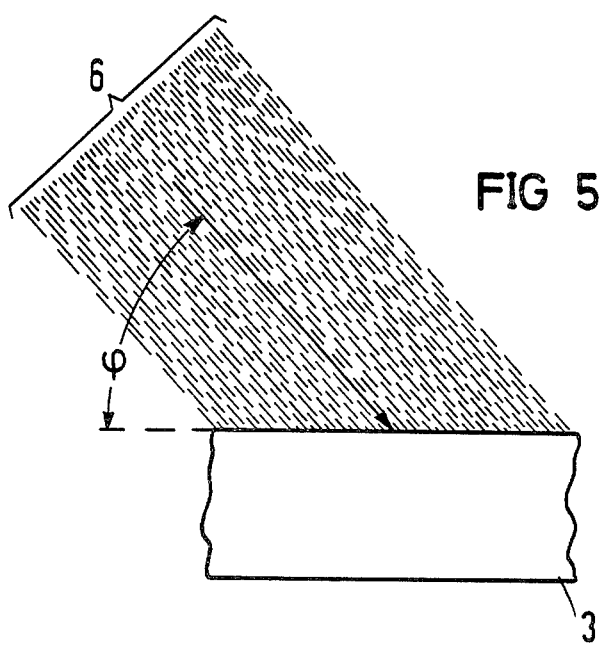
FIG. 5 illustrates a segment of a glass carrier plate, in cross section, the plate being bombarded with particles at a bombardment angle of incidence $\phi$.
Figure 6:
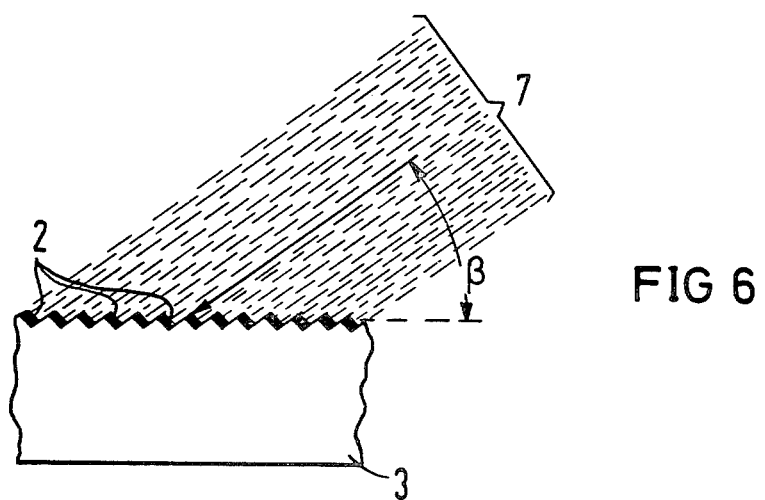
FIG. 6, similarly to FIG. 5, illustrates a cross sectional view of a glass carrier plate, on the surface a multiplicity of micro-grooves are arranged parallel to one another, which grooves are impressed after a particle bombardment, as in FIG. 5, the micro-grooves having interior surfaces facing a vapor deposition source which are provided with electrically conductive strips by means of a material inciding with a vapor deposition angle of incidence $\beta$, so that a multiplicity of micro-strips are provided aligned parallel to one another and separated, and thus electrically insulated from one another.

As already explained above, FIG. 5 illustrates a segment of the glass carrier plate 3 which is bombarded with particle 6 at a bombardment angle of incidence $\phi$ in accordance with one inventive method step. A micro-groove pattern, oriented in parallel or transversely relative to the bombardment direction, depending on the choice of the bombardment angle of incidence $\phi$, is formed by this particle bombardment, the micro-groove pattern being carried out in a second method step in accordance with FIG. 6 by means of vapor deposition perpendicular to the longitudinal extent of the micro-grooves at a prescribed vapor deposition angle of incidence $\beta$, so that respectively only on the interior surfaces of the micro-grooves facing the vapor deposition source is material deposited, whereby a prescribed arrangement of micro-strips 2 is formed on the glass carrier plate 3.

Figure 7:
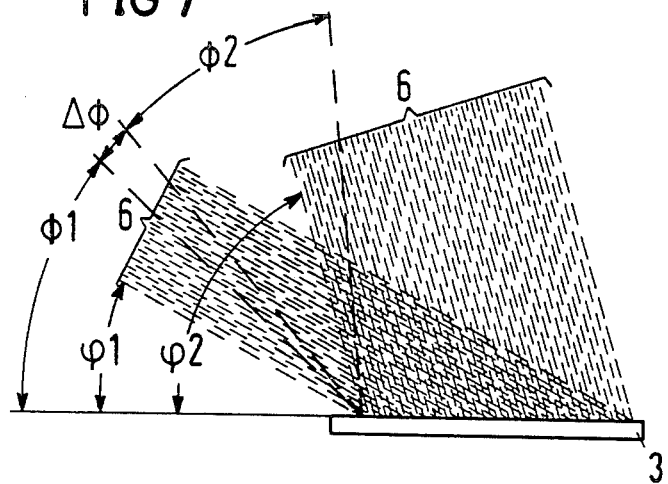
FIG. 7 illustrates, in cross section, a glass carrier plate having a surface which is bombarded with particles at a first angle of incidence $\phi_1$ within a first sector of an angle $\Phi_1$ in a first method step, and is bombarded with particles having a second angle of incidence $\phi_2$ within a second sector of angle $\Phi_2$ in a second method step.
Figure 8:
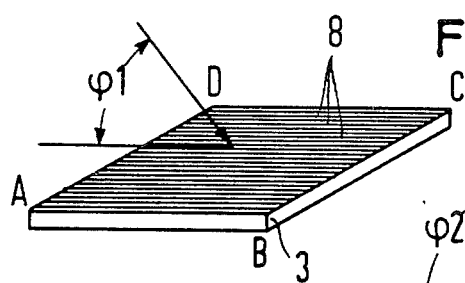
FIG. 8 is a perspective view of a glass carrier plate whose surface is bombarded with particles at a first angle of incidence $\phi_1$ so that a first surface structure is formed.

FIG. 7 illustrates, as also generally explained above, a glass carrier plate, in a cross-sectional view, whose surface is bombarded with particles 6 at a first angle of incidence $\phi 1$ within a first range of angle $\Phi 1$ in a first method step, and is bombarded with particles 6 at a second angle of incidence $\phi 2$ within a second range of angle $\Phi 2$ in a second method step. The surface structures 8 and 9, respectively resulting from the particle bombardment at the first angle of incidence $\phi 1$ or the second angle of incidence $\phi 2$, respectively, are obvious from FIGS. 8 and 9. In the first case, the micro-grooves formed proceed in the direction of the particle bombardment, while in the second case the micro-grooves formed proceed perpendicularly to the direction of bombardment, as can be seen from FIGS. 8 and 9. The two surface structures 8 and 9 overlap, i.e. one structure modulates the other. If the glass carrier plate thus structured is vapor deposited in a third method step with the aid of vapor deposition from a vapor deposition source, which is oriented perpendicular to the longitudinal direction of the micro-grooves produced in the first method step or in the second method step, a deposition of material is formed on the inner surfaces of the micro-grooves facing the vapor deposition source, whereby in toto an arrangement of micro-strips 2 is formed on the glass carrier plate 3 which, moreover, exhibits a function orienting liquid crystal molecules.

Figure 9:
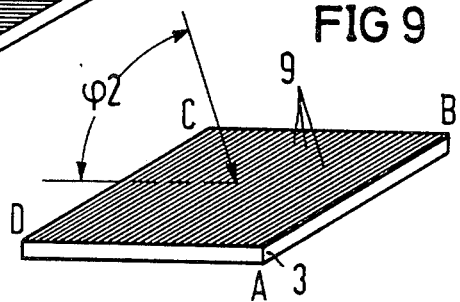
FIG. 9 also illustrates, in a perspective view, a glass carrier plate whose surface is bombarded with particles at a second angle of incidence $\phi_2$, whereby a second surface structure is formed.
Figure 10:
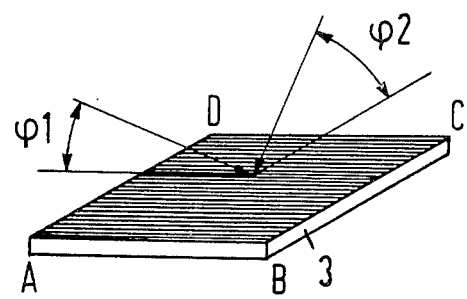
FIG. 10 illustrates a glass carrier plate on whose surface a groove structure is produced in the processing plane of the carrier plate, the groove structure being in accordance with FIG. 8 and being produced in a first operating process by means of a particle bombardment at an angle of incidence $\phi_1$, and a groove structure in parallel to the first-mentioned groove structure in accordance with FIG. 9 by means of a particle bombardment at an angle of incidence $\phi_2$ in a second operating step.

In order to obtain particular properties, in particular for the formation of an optimum value for the groove geometry and for an optimum value for the angle of setting $\theta$, the glass carrier plate 3, in order to carry out the second particle bombardment in accordance with FIGS. 7 or 9, in the processing plane A-B-C-D of the glass carrier plate, is advantageously rotated about an axis which is horizontal relative to the glass carrier plate. The angle of rotation thereby expediently amounts to 90°. The second angle of incidence $\phi 2$ can also be 90° in order to obtain a particularly prescribed ratio of the groove geometry relative to the angle of attack $\theta$.

The sequence of the particle bombardment with a first angle of incidence $\phi 1$ or the second angle of incidence $\phi 2$ can be exchanged, in principle. The surface structure of the glass carrier plate 3 can, depending upon the useful purpose of the finished product, be undertaken in parallel and/or perpendicular relative to the edges A-B, B-C, C-D, D-A of the processing plane A-B-C-D, or can be undertaken obliquely relative to these edges.

Electrically neutral particles or, for example, ions, can be provided for the particle bombardment step. In case ions are utilized, it is provided, if necessary, to neutralize appearing, interfering electrical charges of the processed glass carrier plate by means of measures which are known per se.

An application of material with the aid of sputtering can be provided in the place of a vapor deposition process. Moreover, in a further development of the invention, it is provided that an application of material may take place with selective chemical deposition in accordance with specific method steps known per se, in the place of vapor deposition or sputtering.

The polarizing layer provided by the arrangement of micro-strips oriented parallel to one another is to be separated in an arrangement across a liquid crystal display device in order to prevent interfering electrically conductive connections by means of an insulating layer consisting, for example, of quartz or similar suitable layers.

The setting angle of the orientation of the liquid crystal molecules can also advantageously be set by means of a third method step, namely by means of oblique vapor deposition or oblique removal with the aid of particle bombardment or with the aid of oblique rubbing.

Although we have described our invention by reference to particular embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of my contribution to the art.

We claim:

1. A maskless method of making a polarizer which comprises a plurality of parallel conductive micro-strips, with a raster spacing of approximately one-tenth of a predetermined wavelength, arranged on a glass carrier, comprising the steps of:
  applying an undulating-surfaced conductive layer on a glass carrier by vapor depositing the layer at a first predetermined angle to provide a surface waviness having a period of approximately 50 nm aligned crosswise of the vapor deposition direction; and
  bombarding the layer with particles at a second predetermined angle to remove portions of the layer and produce the spaced conductive micro-strips.

2. The method of claim 1, wherein the step of bombarding is further defined as:
  bombarding the conductive layer with electrically neutral particles.

3. The method of claim 1, wherein the step of bombarding is further defined as:
  bombarding the conductive layer with ions.

4. The method of claim 3, comprising the further step of:
  neutralizing the electrical charge on the glass carrier caused by the ion bombardment.

5. A maskless method of making a polarizer which comprises a plurality of parallel conductive micro-strips, with a raster spacing of approximately one-tenth of a predetermined wavelength, arranged on a glass carrier, comprising the steps of:
  applying a conductive layer on a glass carrier; and
  removing portions of the layer by bombarding the layer with particles at a predetermined angle to provide the micro-strips.

6. The method of claim 5, wherein the step of bombarding is further defined as:
  bombarding the conductive layer with electrically neutral particles.

7. The method of claim 5, wherein the step of bombarding is further defined as:
  bombarding the conductive layer with ions.

8. The method of claim 7, comprising the further step of:
  neutralizing the electrical charge on the glass carrier caused by the ion bombardment.

9. A maskless method of making a polarizer which comprises a plurality of parallel conductive micro-strips, with a raster spacing of approximately one-tenth of a predetermined wavelength, arranged on a glass carrier, comprising the steps of:
  impressing a microgroove pattern into the surface of a glass carrier by bombarding the carrier with particles at a first predetermined angle; and
  vapor depositing, at a second predetermined angle, conductive material on the surfaces of the microgrooves facing the source of deposition material to form the micro-strips.

10. The method of claim 9, wherein the step of bombarding is further defined as:
  bombarding the glass carrier with electrically neutral particles.

11. The method of claim 9, wherein the step of bombarding is further defined as:
  bombarding the glass carrier with ions.

12. The method of claim 11, comprising the further step of:
  neutralizing the electrical charge on the glass carrier caused by the ion bombardment.

13. The method of claim 9, wherein:
  the step of impressing is further defined by the step of selecting said first predetermined angle to provide a wave period in the range of $>50$ nm $<5000$ nm; and
  the step of vapor depositing is further defined by the step of orienting the vapor source at a second predetermined angle to provide an arrangement of micro-strips which exhibits a surface structure, in toto, which orients liquid crystal molecules at a specific angle.

14. The process of claim 13, comprising the step of:
  rotating the carrier about an axis perpendicular to its plane in order to carry out the step of vapor depositing.

15. The method of claim 14, wherein the step of rotating is further defined as:
  rotating the carrier by 90°.

16. The method of claim 13, comprising the step of:
  rotating the particle source about an axis perpendicular to the processing plane of the carrier prior to the vapor deposition step.

17. The method of claim 13, wherein the step of impressing is further defined as
  energizing a first particle gun; and
the step of vapor depositing is further defined as
  energizing a second particle gun displaced at an angle about an axis perpendicular to the plane of the carrier.

18. The method of claim 13, further defined by the step of:
  adjusting said first and second predetermined angles at a predetermined ratio with respect to one another in order to produce the specific angle of the liquid crystal molecular alignment and a prescribed groove depth.

19. The method of claim 18, wherein said second predetermined angle is adjusted to 90°.

20. The method of claim 18, wherein the step of impressing is carried out parallel to the edges of the processing plane of the carrier.

21. The method of claim 18, wherein the step of impressing is carried out perpendicular to the edges of the processing plane of the carrier.

22. The method of claim 18, wherein the step of impressing is carried out parallel and perpendicular to the edges of the processing plane of the carrier.

23. The method of claim 18, wherein the step of impressing is carried out oblique to the edges of the processing plane of the carrier.

24. A maskless method of making a polarizer which comprises a plurality of parallel conductive micro-strips, with a raster spacing of approximately one-tenth of a predetermined wavelength, arranged on a glass carrier, comprising the steps of:
   applying an undulating-surfaced conductive layer on a glass carrier by sputtering to deposit the layer at a first predetermined angle to provide a surface waviness having a period of approximately 50 nm aligned crosswise of the sputtering direction; and
   bombarding the layer with particles at a second predetermined angle to remove portions of the layer and produce the spaced conductive micro-strips.

25. A maskless method of making a polarizer which comprises a plurality of parallel conductive micro-strips, with a raster spacing of approximately one-tenth of a predetermined wavelength, arranged on a glass carrier, comprising the steps of:
   sputtering a conductive layer on a glass carrier; and
   removing portions of the layer by bombarding the layer with particles at a predetermined angle to provide the micro-strips.

26. A maskless method of making a polarizer which comprises a plurality of parallel conductive micro-strips, with a raster spacing of approximately one-tenth of a predetermined wavelength, arranged on a glass carrier, comprising the steps of:
   applying an undulating-surfaced conductive layer on a glass carrier by selective chemical deposition of the layer; and
   removing portions of the layer by particle bombardment to produce the spaced conductive micro-strips.

27. A maskless method of making a polarizer which comprises a plurality of parallel conductive micro-strips, with a raster spacing of approximately one-tenth of a predetermined wavelength, arranged on a glass carrier, comprising the steps of:
   applying a conductive layer by selective chemical deposition on a glass carrier; and
   removing portions of the layer by bombarding the layer with particles at a predetermined angle to provide the micro-strips.

* * * * *